(12) United States Patent
Kanai et al.

(10) Patent No.: US 12,142,954 B2
(45) Date of Patent: Nov. 12, 2024

(54) CELL CONTROLLER, BATTERY CONTROLLER, BATTERY MANAGEMENT SYSTEM, AND BATTERY SYSTEM

(71) Applicant: Hitachi Astemo, Ltd., Hitachinaka (JP)

(72) Inventors: Tomonori Kanai, Hitachinaka (JP); Hikaru Miura, Hitachinaka (JP)

(73) Assignee: Hitachi Astemio, Ltd., Hitachinaka (JP)

( * ) Notice: Subject to any disclaimer, the term of this patent is extended or adjusted under 35 U.S.C. 154(b) by 447 days.

(21) Appl. No.: 17/294,557

(22) PCT Filed: Oct. 9, 2019

(86) PCT No.: PCT/JP2019/039876
§ 371 (c)(1),
(2) Date: May 17, 2021

(87) PCT Pub. No.: WO2020/105303
PCT Pub. Date: May 28, 2020

(65) Prior Publication Data
US 2021/0408804 A1 Dec. 30, 2021

(30) Foreign Application Priority Data
Nov. 22, 2018 (JP) .................................. 2018-219305

(51) Int. Cl.
*H02J 7/14* (2006.01)
*B60L 58/22* (2019.01)
(Continued)

(52) U.S. Cl.
CPC ............ *H02J 7/0014* (2013.01); *B60L 58/22* (2019.02); *G01R 31/382* (2019.01);
(Continued)

(58) Field of Classification Search
CPC .... H02J 7/0014; H02J 7/0048; G01R 31/382; B60L 58/22; H01M 10/425;
(Continued)

(56) References Cited

U.S. PATENT DOCUMENTS

2008/0072859 A1* 3/2008 Esaka ................... H02J 7/0019
320/117
2011/0248675 A1* 10/2011 Shiu ...................... H02J 7/0016
320/118
(Continued)

FOREIGN PATENT DOCUMENTS

JP 2003-282159 A 10/2003
JP 2006-304394 A 11/2006
(Continued)

OTHER PUBLICATIONS

Emori et al., EP Patent Document No. EP-2400626-A2, published Dec. 29, 2011, 4 pages including abstract and 1 drawing. (Year: 2011).*

(Continued)

*Primary Examiner* — Phallaka Kik
(74) *Attorney, Agent, or Firm* — Crowell & Moring LLP

(57) ABSTRACT

A cell controller includes: a balancing unit which performs balancing of states of charge of a plurality of secondary batteries by discharging or charging each of the plurality of secondary batteries; a first timer which measures an elapsed time after a start of the balancing; a receiving unit which receives a balancing command signal including information regarding balancing times for the secondary batteries; and a first control unit which controls the balancing unit on a basis of the elapsed time after the start of the balancing, and the balancing command signal, the elapsed time being measured by the first timer and the balancing command signal being received by the receiving unit, in which the receiving unit
(Continued)

receives the information on the plurality of secondary batteries through the single balancing command signal.

14 Claims, 9 Drawing Sheets

(51) Int. Cl.
    *G01R 31/382*     (2019.01)
    *H01M 10/42*     (2006.01)
    *H01M 10/44*     (2006.01)
    *H01M 10/48*     (2006.01)
    *H02J 7/00*     (2006.01)

(52) U.S. Cl.
    CPC ....... *H01M 10/425* (2013.01); *H01M 10/441* (2013.01); *H01M 10/48* (2013.01); *H01M 10/482* (2013.01); *H02J 7/0048* (2020.01); *H01M 2010/4271* (2013.01); *H01M 2010/4278* (2013.01); *H01M 2220/20* (2013.01)

(58) Field of Classification Search
    CPC .. H01M 10/441; H01M 10/48; H01M 10/482; H01M 10/4271; H01M 2010/4278; H01M 2010/4271; H01M 2220/20
    USPC .................. 320/134, 155, 160, 133, 136
    See application file for complete search history.

(56) References Cited

U.S. PATENT DOCUMENTS

| | | | |
|---|---|---|---|
| 2011/0316520 A1* | 12/2011 | Kawahara | B60L 58/15 323/351 |
| 2014/0176078 A1* | 6/2014 | Lai | H02J 7/0014 320/134 |
| 2015/0042484 A1* | 2/2015 | Bansal | G08B 29/00 340/693.3 |
| 2015/0231985 A1* | 8/2015 | Li | B60L 58/22 320/134 |
| 2016/0031330 A1* | 2/2016 | Ishigaki | B60L 53/39 307/20 |
| 2016/0352107 A1* | 12/2016 | Yoshida | H02J 7/0048 |
| 2016/0370436 A1* | 12/2016 | Kim | B66F 9/24 |
| 2018/0241100 A1 | 3/2018 | Kudo et al. | |
| 2018/0257502 A1* | 9/2018 | Park | H02J 50/10 |
| 2018/0269694 A1* | 9/2018 | Nam | H01M 10/441 |

FOREIGN PATENT DOCUMENTS

| | | | | |
|---|---|---|---|---|
| JP | 2013-85363 A | | 5/2013 | |
| JP | 2014155405 A | * | 8/2014 | |
| JP | 2015-41513 A | | 3/2015 | |
| JP | 2017108483 A | * | 6/2017 | |
| JP | 6242516 B1 | * | 12/2017 | |
| JP | 2018-125970 A | | 8/2018 | |
| WO | WO-2015030392 A1 | * | 3/2015 | ............ H02J 7/0014 |
| WO | WO 2017/043237 A1 | | 3/2017 | |

OTHER PUBLICATIONS

Chen et al., Chinese Patent Document No. CN-104578286-A, published Apr. 29, 2015, 3 pages including abstract and 1 drawing. (Year: 2015).*

Hikari (Japanese Patent Document No. JP-2015-041513, published Mar. 2, 2015, English machine translated on Jun. 28, 2023 at JPO website, 27 pages). (Year: 2023).*

English Translation of Written Opinion for PCT/JP2019/039876, mailed on Nov. 5, 2019, 9 pages. (Year: 2019).*

International Search Report (PCT/ISA/210) issued in PCT Application No. PCT/JP2019/039876 dated Nov. 5, 2019 with English translation (four (4) pages).

Chinese-language Office Action issued in Chinese Application No. 201980074771.6 dated Aug. 8, 2023 with English translation (20 pages).

English translation of Written Opinion (PCT/ISA/237) issued in PCT Application No. PCT/JP2019/039876 dated Nov. 5, 2019 (nine (9) pages).

* cited by examiner

CELL CONTROLLER, BATTERY CONTROLLER, BATTERY MANAGEMENT SYSTEM, AND BATTERY SYSTEM

TECHNICAL FIELD

The present invention relates to a cell controller and a battery controller, and a battery management system and a battery system using them.

BACKGROUND ART

In vehicles such as hybrid electric vehicles (HEVs) and electric vehicles (EVs) that are driven using power supplied from secondary batteries, an assembled battery (battery system) in which a number of battery cells of the secondary batteries are connected in series has been generally used in order to secure a desired high voltage. Conventionally, a battery management device is connected to such an assembled battery via a wire harness for capacity calculation or protection management of each battery cell. The battery management device controls a charge/discharge state of each battery cell to manage each battery cell.

The above-described battery management device has been known to perform balancing to equalize the voltages of the respective battery cells by individually discharging each battery cell in order to reduce the voltage variation between the respective battery cells. The battery management device usually uses power of a low-voltage battery such as a lead storage battery mounted on a vehicle separately from the assembled battery to perform balancing while the vehicle is stopped. Therefore, in order to prevent the battery from being depleted while the vehicle is stopped, it is necessary to suppress power consumption of the battery management device during balancing as much as possible.

A technology of PTL 1 has been proposed for reducing the power consumption of the battery management device during balancing. A battery management device disclosed in PTL 1 is a battery control system that individually adjusts capacities of a plurality of lithium secondary batteries included in an assembled battery, the battery control system including: a voltage measurement means that measures an open circuit voltage of each of the lithium secondary batteries; a computation means that computes a capacity adjustment time of a corresponding lithium secondary battery from the open circuit voltage measured by the voltage measurement means; a capacity adjustment means that adjusts a capacity of the corresponding lithium secondary battery during the capacity adjustment time computed by the computation means; and an operation control means that causes the voltage measurement means and the computation means to be operated for a predetermined time in a case where the assembled battery is not used for a predetermined period, in which the capacity adjustment means starts capacity adjustment of the lithium secondary battery within the predetermined time, and continues the capacity adjustment of the lithium secondary battery even after the predetermined time elapses, and the voltage measurement means and the computation means enter a low power consumption mode after the predetermined time elapses.

CITATION LIST

Patent Literature

PTL 1: JP 2003-282159 A

SUMMARY OF INVENTION

Technical Problem

In the technology described in PTL 1, since a plurality of timers corresponding to a plurality of battery cells are arranged, the device is complicated, which is problematic.

Solution to Problem

A cell controller according to the present invention includes: a balancing unit which performs balancing of states of charge of a plurality of secondary batteries by discharging or charging each of the plurality of secondary batteries; a first timer which measures an elapsed time after a start of the balancing; a receiving unit which receives a balancing command signal including information regarding balancing times for the secondary batteries; and a first control unit which controls the balancing unit on a basis of the elapsed time after the start of the balancing, and the balancing command signal, the elapsed time being measured by the first timer and the balancing command signal being received by the receiving unit, in which the receiving unit receives the information on the plurality of secondary batteries through the single balancing command signal.

A battery controller according to the present invention is configured to perform communication with the cell controller, and includes: a second control unit which computes balancing times for the plurality of secondary batteries; and a transmitting unit which transmits, to the cell controller, a balancing command signal including information on the balancing times computed by the second control unit, in which the transmitting unit transmits the information on the plurality of secondary batteries through the single balancing command signal.

A battery management system according to the present invention includes the cell controller and the battery controller.

A battery system according to the present invention includes: the battery management system; and a plurality of secondary batteries to be subjected to balancing by the battery management system.

Advantageous Effects of Invention

According to the present invention, it is possible to suppress the power consumption of the battery controller during balancing with a simple configuration.

DESCRIPTION OF EMBODIMENTS

First Embodiment

Figure 1:
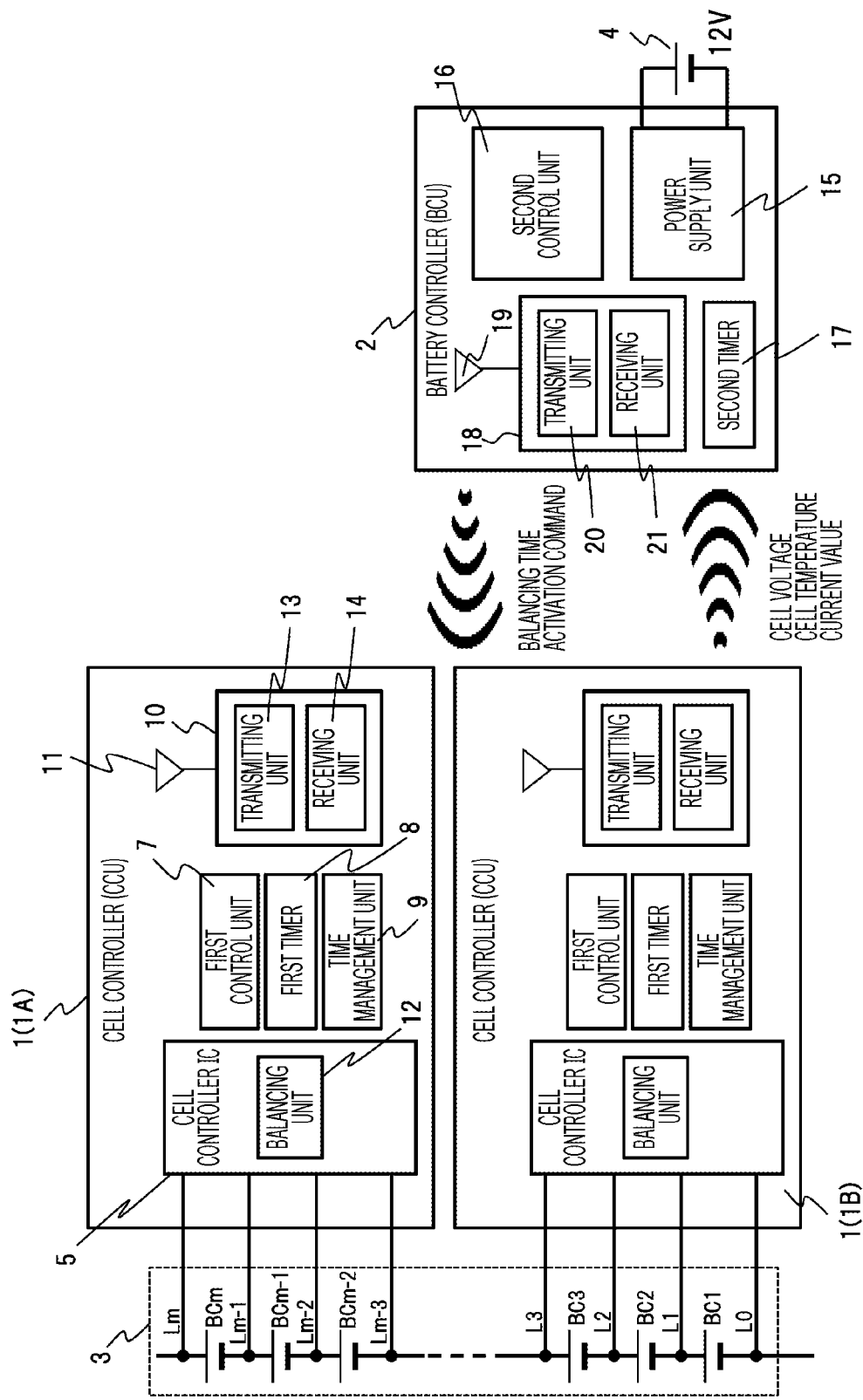
FIG. 1 is a diagram illustrating a battery management system and a battery system according to an embodiment of the present invention.

FIG. 1 is a diagram illustrating a battery management system and a battery system according to an embodiment of the present invention. The battery management system illustrated in FIG. 1 includes a plurality of cell controllers (hereinafter, abbreviated as "CCU") 1 and a battery controller (hereinafter, abbreviated as "BCU") 2, and manages m battery cells 3 (m is an arbitrary natural number) connected in series. The battery management system and m battery cells 3 constitute a battery system of the present embodiment. Note that, in the following description, the battery cell 3 may be simply referred to as a "cell".

The battery system of the present embodiment is mounted on and used in a vehicle such as a hybrid electric vehicle (HEV) or an electric vehicle (EV), and supplies power for driving a motor of the vehicle. Hereinafter, the battery system of the present embodiment will be described by taking, as an example, such a battery system used for driving a motor of a vehicle.

Each CCU 1 is connected to a plurality of battery cells 3, and manages the respective corresponding battery cells 3 on the basis of a command from the BCU 2. The management of the battery cells 3 performed by the CCU 1 includes balancing for making a variation in state of charge (SOC) of the battery cells 3 be within a certain range. Each CCU 1 performs balancing of corresponding battery cells 3 for the purpose of widening the range of the SOC that can be used in the battery cells 3. Note that the balancing performed by the CCU 1 will be described in detail later.

The BCU 2 transmits, to each CCU 1, a balancing command signal for causing each CCU 1 to perform balancing. The balancing command signal includes information regarding balancing times for the plurality of battery cells 3 to which each CCU 1 is connected. In addition, the BCU 2 receives information transmitted from each CCU 1, such as a cell voltage, a cell temperature, and a current value, and generates the balancing command signal on the basis of the information.

Each battery cell 3 is implemented by using a secondary battery such as a lithium-ion battery, supplies DC power for generating AC power for driving a motor to an inverter (not illustrated), which is a load, and is charged with DC power generated on the basis of AC power from the motor that currently generates regenerative power, or a commercial power supply. Note that, in FIG. 1, m battery cells 3 are represented by BC1 to BCm, and lines connecting the CCU 1 and positive and negative electrodes of the respective battery cells 3 are represented by L0 to Lm. In addition, the BCU 2 is connected to a lead storage battery 4.

Next, the CCU 1 and the BCU 2 constituting the battery management system of the present embodiment will be described in detail.

First, the CCU 1 will be described. The CCU 1 is operated using the battery cell 3 as a power source, and includes a cell controller integrated circuit (hereinafter, abbreviated as "cell controller IC") 5, a first control unit 7, a first timer 8, a time management unit 9, a CCU-side wireless device 10, and a CCU-side antenna 11. The cell controller IC 5 includes a balancing unit 12 and an AD converter (not illustrated). The CCU-side wireless device 10 includes a CCU-side transmitting unit 13 and a CCU-side receiving unit 14.

Note that, in FIG. 1, among the plurality of CCUs 1 in the battery management system of the present embodiment, a CCU 1A connected to the respective battery cells 3, that is, BCm-2, BCm-1, and BCm arranged on the highest potential side of the assembled battery, and a CCU 1B connected to the respective battery cells 3, that is, BC1, BC2, and BC3 arranged on the lowest potential side of the assembled battery are illustrated, and CCUs 1 connected to other battery cells 3 are omitted. However, in actual implementation, the number of CCUs 1 included in the battery management system and the number of battery cells 3 connected to each CCU 1 are not limited to those in the example illustrated in FIG. 1, and can be set arbitrarily. In the following, the configuration and operation of the plurality of CCUs 1 will be described using the CCU 1A as an example.

The CCU-side receiving unit 14 included in the CCU-side wireless device 10 receives a wireless signal transmitted from the BCU 2 via the CCU-side antenna 11. For example, the CCU-side receiving unit 14 receives the above-described balancing command signal including information regarding the balancing time for each battery cell 3, an activation signal including an activation command for the CCU 1, or the like, through the wireless signal from the BCU 2. When the wireless signal is received from the BCU 2, the CCU-side receiving unit 14 demodulates the wireless signal and outputs the demodulated signal to the first control unit 7.

The CCU-side transmitting unit 13 included in the CCU-side wireless device 10 modulates a signal input from the first control unit 7 to generate a wireless signal, and transmits the wireless signal to the BCU 2 via the CCU-side antenna 11. For example, the CCU-side transmitting unit 13 transmits information such as a cell voltage, a cell temperature, and a current value acquired from each battery cell 3 to the BCU 2 through the wireless signal.

Note that examples of a wireless signal modulation scheme used in the CCU-side wireless device 10 include phase shift keying (PSK). Further, examples of a communication scheme using the PSK modulation scheme include IEEE 802.15.4.

The first control unit 7 performs a balancing control for the battery cell 3 by controlling the balancing unit 12 included in the cell controller IC 5 on the basis of the balancing command signal wirelessly received by the CCU-side receiving unit 14. At this time, the first control unit 7 performs the balancing control by using a time measured by the first timer 8. The first timer 8 measures an elapsed time after the balancing unit 12 starts balancing. Note that the balancing control performed by the first control unit 7 will be described in detail later. Each first control unit 7 is implemented by using, for example, a computation processing circuit such as a central processing unit (CPU), a field programmable gate array (FPGA), or an application specific integrated circuit (ASIC), and various programs used in combination therewith.

The balancing unit 12 performs balancing of the respective battery cells 3 by discharging or charging each of the plurality of battery cells 3 to which the CCU 1 is connected, under the control of the first control unit 7. The balancing unit 12 includes a plurality of balancing switches (not illustrated) each connected between the positive and negative electrodes of each battery cell 3, and can turn on or off each of the plurality of balancing switches under the control of the first control unit 7 to perform balancing by discharging or charging each battery cell 3. The balancing unit 12 is implemented by using, for example, some circuits in the cell controller IC 5, which is an integrated circuit, or various electric components provided along with the cell controller IC 5.

The first control unit 7 performs a control to shift the CCU 1 to a predetermined low power consumption mode after the balancing control of the balancing unit 12 is completed. In the low power consumption mode, the CCU 1 stops the operation of each component in the CCU 1 except for the component necessary for receiving the activation signal when the activation signal is transmitted from the BCU 2. As a result, it is possible to reduce the power consumption after the balancing is completed.

However, in a case where an abnormality that the CCU cannot be shifted to the low power consumption mode occurs, the charge of the battery cell 3 continues to be discharged by the operation of the CCU 1, and in the worst case, there is a possibility that the vehicle cannot travel. Examples of such an abnormality include an abnormality that the balancing cannot be stopped even after a predetermined balancing time elapses due to a failure of the first timer 8, a failure of the first control unit 7, or the like, an abnormality that a wait mode that consumes more power than the low power consumption mode continues after the balancing is stopped, and the like. To solve this problem, the CCU 1 includes the time management unit 9.

The time management unit 9 has a function of stopping the CCU 1 when the CCU 1 has an abnormality that the CCU 1 cannot be shifted to the low power consumption mode. A stop time longer than a time required for the balancing control is set in the time management unit 9, and once an elapsed time after the start of the balancing exceeds the stop time, the time management unit 9 can stop the CCU 1. As the stop time set in the time management unit 9, a predetermined fixed value, a set value from the BCU 2, or the like can be used. Further, the time management unit 9 may monitor the abnormality of the first timer 8 and stop the CCU 1 when the abnormality is detected. The time management unit 9 may be implemented as, for example, one function of the CPU or FPGA used as the first control unit 7, or may be implemented by using hardware other than the first control unit 7.

When the activation signal wirelessly transmitted from the BCU 2 is received in the low power consumption mode, the CCU 1 is activated and releases the low power consumption mode. When the CCU-side receiving unit 14 receives the balancing command signal transmitted from the BCU 2 after the activation, the first control unit 7 manages the balancing of the plurality of battery cells 3 by using the first timer 8.

Next, the BCU 2 will be described. The BCU 2 is operated using the lead storage battery 4 as a power source, and includes a power supply unit 15, a second control unit 16, a second timer 17, a BCU-side wireless device 18, and a BCU-side antenna 19. The BCU-side wireless device 18 includes a BCU-side transmitting unit 20 and a BCU-side receiving unit 21.

The power supply unit 15 supplies operating power to each part of the BCU 2 on the basis of power supplied from the lead storage battery 4.

The BCU-side receiving unit 21 receives the wireless signal transmitted from the CCU 1 via the BCU-side antenna 19. The wireless signal includes the information such as a cell voltage, a cell temperature, and a current value of each battery cell 3, acquired by the CCU 1. When the wireless signal is received from the CCU 1, the BCU-side receiving unit 21 demodulates the wireless signal and outputs the demodulated signal to the second control unit 16.

When the above-described balancing command signal or activation signal is input from the second control unit 16, the BCU-side transmitting unit 20 modulates these signals to generate a wireless signal, and transmits the wireless signal to the CCU 1 via the BCU-side antenna 19.

The second control unit 16 calculates the SOC, state of health (SOH), allowable power, and the like of each battery cell 3 on the basis of the information of each battery cell 3 included in the signal received and demodulated by the BCU-side receiving unit 21. Further, the second control unit 16 computes the balancing time for each battery cell 3 on the basis of the calculated SOC, generates the balancing command signal according to the computation result, and outputs the balancing command signal to the BCU-side transmitting unit 20. When the balancing command signal is input from the second control unit 16, the BCU-side transmitting unit 20 modulates the balancing command signal to generate a wireless signal, and transmits the wireless signal to the CCU 1 via the BCU-side antenna 19. As a result, the balancing times for the plurality of battery cells 3 connected to the CCU 1 are transmitted from the BCU 2 to the CCU 1. After the balancing command signal is transmitted by the BCU-side transmitting unit 20, the second control unit 16 is shifted to a predetermined low power consumption mode.

Note that the BCU 2 collectively transmits, to the CCU 1, information on the balancing times for the plurality of battery cells 3 connected to the CCU 1 through a single balancing command signal. Therefore, in the CCU 1, the CCU-side receiving unit 14 receives the information on the balancing times for the plurality of battery cells 3 that are balancing targets through the single balancing command signal transmitted from the BCU 2. Accordingly, it can be sufficient that activation of the BCU 2, which is necessary when performing balancing, and transmission of the balancing command signal from the BCU 2 to the CCU 1 are each performed only once. As a result, it is possible to reduce the power consumption of the BCU 2 during the balancing.

The second timer 17 measures an elapsed time after the BCU 2 is shifted to the low power consumption mode, and once the elapsed time reaches a predetermined activation time, the second timer instructs the power supply unit 15 to activate the BCU 2, thereby reactivating the BCU 2. At this time, the power supply unit 15 restarts the supply of the operating power to each part of the BCU 2 in response to the instruction from the second timer 17.

The second control unit 16 sets an activation time in the second timer 17, and then shifts the BCU 2 to the low power consumption mode. The second timer 17 instructs the power supply unit 15 to activate the BCU 2 after the set activation time elapses.

Once the BCU 2 is activated and releases the low power consumption mode, the activation signal is transmitted to the CCU 1 to activate the CCU 1. Thereafter, the BCU 2 transmits an information acquisition command for each battery cell 3 to the CCU 1. The CCU 1 acquires the information of each battery cell 3 according to the information acquisition command from the BCU 2 and transmits the information to the BCU 2.

The BCU 2 computes the SOC of each cell and the balancing time for each cell by using the information of each battery cell 3 transmitted from the CCU 1, and transmits the balancing command signal to the CCU 1. Here, a part or the entirety of the information of the battery cell 3 acquired by the CCU 1 may be replaced with the information acquired by the BCU 2. For example, a current value may be acquired by arranging shunt resistors connected to a plurality of battery cells 3 in series and acquiring, by an AD converter (not illustrated) included in the BCU 2, a voltage drop due to the shunt resistors. Further, instead of the balancing time for each cell, information on the voltage and SOC of each cell may be transmitted from the BCU 2 to the CCU 1 through the balancing command signal. In this case, the CCU 1 can calculate the balancing time from the voltage and SOC of each cell. That is, in a case where the CCU 1 can determine the balancing time for each cell, it is possible to include, as the information on the balancing time, arbitrary information in the balancing command signal.

After transmitting the balancing command signal, BCU 2 is shifted to the low power consumption mode again. When the CCU 1 receives the balancing command signal from the BCU 2, the CCU 1 is shifted to the low power consumption mode after performing balancing.

Figure 2:
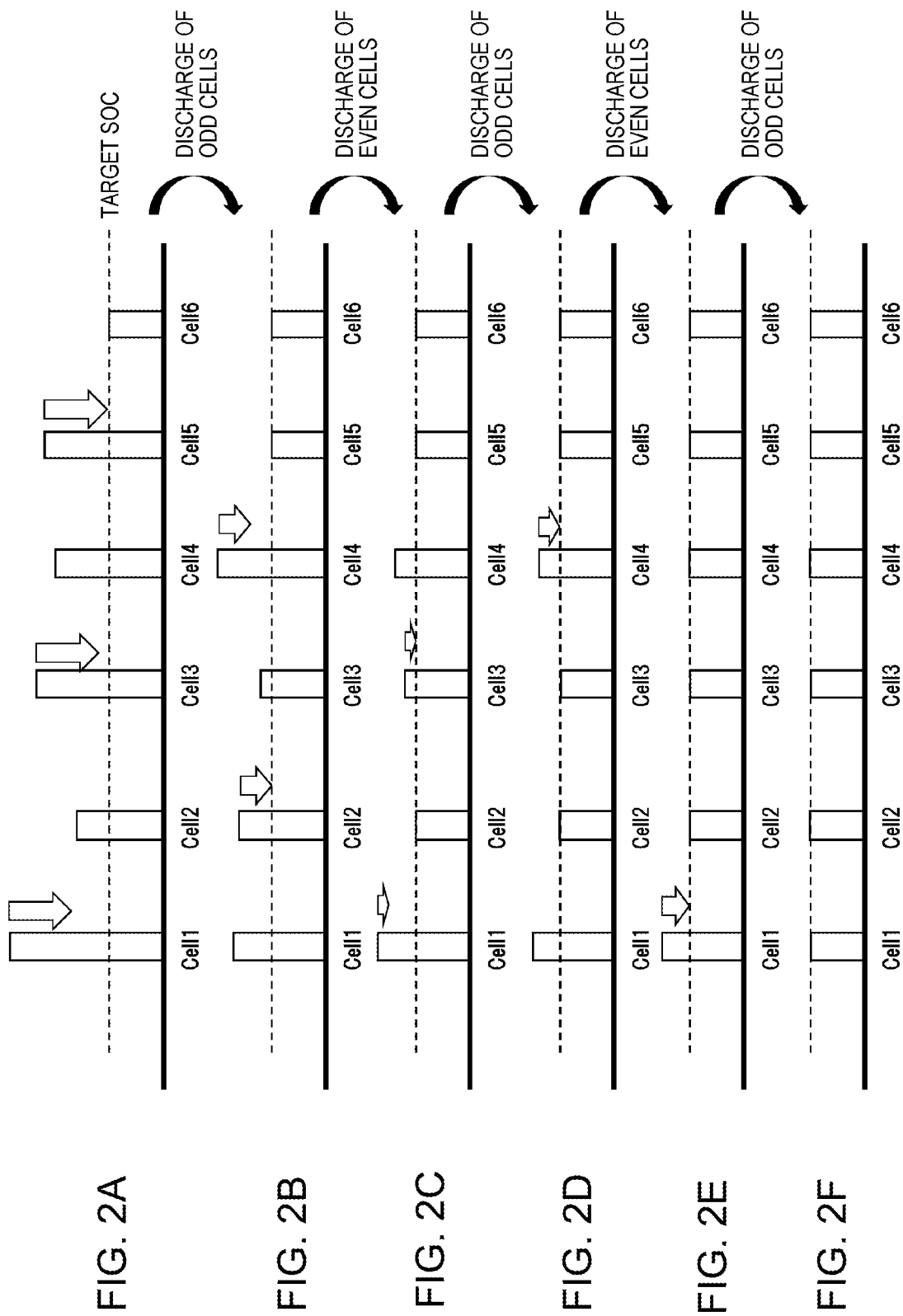
FIGS. 2A-2F are diagrams illustrating an example of a balancing control according to a first embodiment of the present invention.

Next, the balancing control performed by the first control unit 7 in the CCU 1 will be described. FIG. 2 is a diagram illustrating an example of a balancing control according to a first embodiment of the present invention. In FIG. 2, (a) to (f) illustrate an example of a balancing control in which six battery cells 3 are connected to one CCU 1, and the SOC is equalized between six battery cells 3. In FIGS. 2(a) to (f), "Cell 1" to "Cell 6" correspond to six battery cells 3 connected to the same CCU 1, and the SOCs of these six battery cells 3 are represented by bar graphs. Note that the level of the SOC of each battery cell 3 corresponds to the balancing time for each battery cell 3.

As described above, the balancing in the battery system of the present embodiment is performed for the purpose of equalizing the SOC between a plurality of cells connected in series in order to widen the range of the SOC that can be used in the battery cells 3. Hereinafter, the balancing control of the present embodiment will be described by taking, as an example, passive balancing in which the SOCs are equalized by discharging each battery cell 3. However, active balancing, in which the SOCs are equalized by discharging or charging each cell to transfer the charge between cells, may also be applied. In a case where the active balancing is used, it is possible to suppress the power consumption of all of the plurality of battery cells 3.

Further, in a case where, among a plurality of battery cells 3 connected in series, adjacent cells are discharged at the same time, the voltage applied to the balancing unit 12 becomes high, and thus, it is necessary to increase the size of the cell controller IC 5. Therefore, the present embodiment makes it a condition that adjacent cells cannot be discharged at the same time, and each even-numbered connected battery cell 3 from the low potential side (hereinafter, referred to as "even cell") or each odd-numbered connected battery cell 3 from the low potential side (hereinafter, referred to as "odd cell") can be discharged at the same time.

Hereinafter, the voltage applied to the balancing unit 12 when adjacent cells are discharged at the same time will be described. When one of the plurality of battery cells 3 in FIG. 1, for example, the cell BCm-1, is discharged, the balancing unit 12 turns on the balancing switch disposed between the connection line Lm-1 connected to the positive electrode of the cell BCm-1 and the connection line Lm-2 connected to the negative electrode of the cell BCm-1 to make the impedance between the connection line Lm-1 and the connection line Lm-2 low. At this time, since the potential of the connection line Lm-1 becomes closer to the potential of the connection line Lm-2, the voltage between the connection line Lm-1 and the connection line Lm is about twice the voltage before discharging. On the other hand, when two adjacent cells, for example, the cell BCm-1 and the cell BCm-2, are discharged at the same time, the balancing unit 12 turns on the balancing switch disposed between the connection line Lm-2 connected to the positive electrode of the cell BCm-2 and the connection line Lm-3 connected to the negative electrode of the cell BCm-2, in addition to the balancing switch disposed between the connection line Lm-1 and the connection line Lm-2. As a result, the impedance between the connection line Lm-1 and the connection line Lm-2, and the impedance between the connection line Lm-2 and the connection line Lm-3 become low. At this time, since the potential of the connection line Lm-1 becomes closer to the potential of the connection line Lm-3, the voltage between the connection line Lm-1 and the connection line Lm is about three times the voltage before discharging.

As described above, when adjacent cells are discharged at the same time, the voltage applied to the balancing unit 12 becomes higher than that in a case where one cell is discharged. Note that, as the number of adjacent cells discharged at the same time is increased, the voltage applied to the balancing unit 12 becomes higher according to the number of adjacent cells. Therefore, it can be seen that it is necessary to improve the withstand voltage performance of the cell controller IC 5 including the balancing unit 12 in a case where adjacent cells are discharged at the same time. In general, it is necessary to increase the size of an element in order to improve the withstand voltage performance, and thus, simultaneous discharge of adjacent cells may lead to an increase in size of the cell controller IC 5.

FIG. 2(a) illustrates the SOCs of Cell 1 to Cell 6 before the start of balancing. In FIG. 2(a), Cell 6 has the lowest SOC. Therefore, in the balancing, the SOC of Cell 6 is set as a target SOC, and Cell 1 to Cell 5 are discharged so as to make the SOCs of Cell 1 to Cell 5 equal to the target SOC.

In a case where the balancing is started in the state illustrated in FIG. 2(a), the first control unit 7 first discharges odd cells, that is, Cell 1, Cell 3, and Cell 5. Among these odd cells, Cell 5 has the SOC closest to the target SOC, that is, the lowest SOC. Therefore, the first control unit 7 sets a discharge time of the odd cells so that the SOC of Cell 5 is decreased to reach the target SOC, and discharges Cell 1, Cell 3, and Cell 5 during the discharge time. As a result, a state illustrated in FIG. 2(b) is achieved.

When the discharge of the odd cells is completed and the state illustrated in FIG. 2(b) is achieved, the first control unit 7 then discharges even cells, that is, Cell 2 and Cell 4. Although Cell 6 is also an even cell, Cell 6 is excluded from the balancing target because the SOC of Cell 6 is set as the target SOC. Among these even cells that are the balancing targets, Cell 2 has the SOC closest to the target SOC, that is, the lowest SOC. Therefore, the first control unit 7 sets a discharge time of the even cells so that the SOC of Cell 2 is decreased to reach the target SOC, and discharges Cell 2 and Cell 4 during the discharge time. As a result, a state illustrated in FIG. 2(c) is achieved.

Thereafter, similarly, the discharge of the odd cells and the discharge of the even cells are alternately and repeatedly performed. That is, in the state illustrated in FIG. 2(c), Cell 1 and Cell 3 whose SOC is not the target SOC among the odd cells are discharged, and a state illustrated in FIG. 2(d) is achieved. In the state illustrated in FIG. 2(d), Cell 4 whose SOC is not the target SOC among the even cells is discharged, and a state illustrated in FIG. 2(e) is achieved. In the state illustrated in FIG. 2(e), Cell 1 whose SOC is not the target SOC among the odd cells is discharged, and a state illustrated in FIG. 2(f) is achieved. As a result, the SOCs of Cell 1 to Cell 6 are equalized as illustrated in FIG. 2(f).

It can be seen that the balancing control performed by the first control unit 7 as described above makes it possible to equalize the SOC between all of six battery cells 3 whose SOCs were not uniform before the start of balancing.

Figure 3:
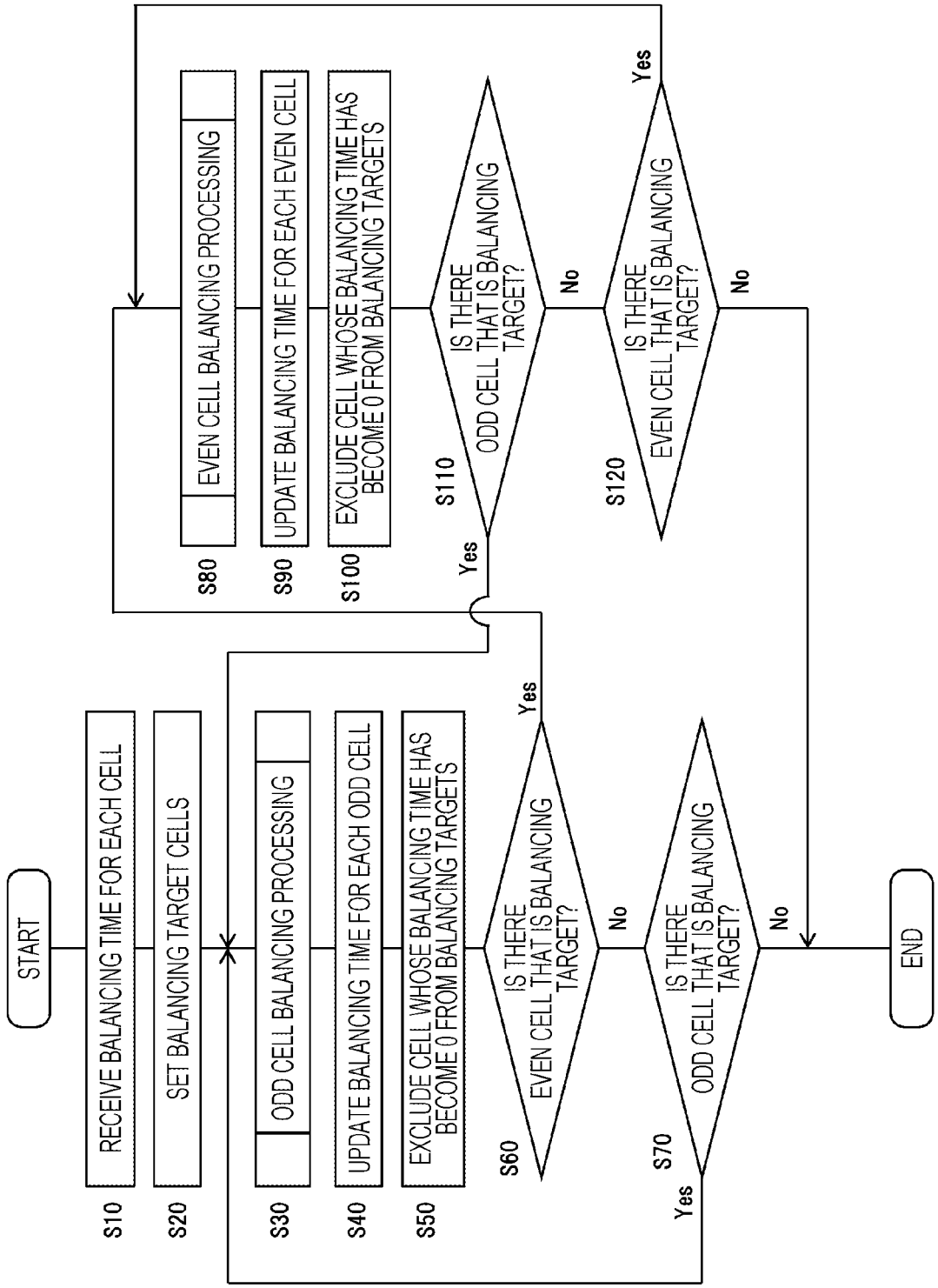
FIG. 3 is a flowchart of the balancing control according to the first embodiment of the present invention.

FIG. 3 is a flowchart of the balancing control according to the first embodiment of the present invention. In the CCU 1 of the battery management system of the present embodiment, for example, when the balancing command signal is transmitted from the BCU 2 and received by the CCU-side receiving unit 14, the first control unit 7 performs the balancing control illustrated in the flowchart of FIG. 3.

In Step S10, the first control unit 7 receives the balancing time for each cell from the CCU-side receiving unit 14. Here, the CCU-side receiving unit 14 receives and acquires information on the balancing time for each cell, included in the balancing command signal received by the CCU-side receiving unit 14 from the BCU 2.

In Step S20, the first control unit 7 sets balancing target cells on the basis of the balancing time for each cell received in Step S10. Here, respective cells excluding a cell whose balancing time is 0, that is, a cell having the lowest SOC which is the target SOC, are set as the balancing target cells.

In Step S30, the first control unit 7 performs odd cell balancing processing for performing the balancing control for odd cells. In the odd cell balancing processing, balancing is performed for odd cells among the balancing target cells set in Step S20. However, an odd cell excluded from the balancing targets in Step S50, which will be described later, is not a processing target in Step S30. Note that the odd cell balancing processing in Step S30 will be described in detail later with reference to the flowchart of FIG. 4.

In Step S40, the first control unit 7 updates the balancing time for each odd cell that is the balancing target cell. Here, the balancing time for each odd cell is updated by subtracting an odd cell discharge time To set in the odd cell balancing processing in Step S30 from the balancing time for each odd cell that is the balancing target cell. Note that a method of setting the odd cell discharge time To will be described later in the description of the odd cell balancing processing.

In Step S50, the first control unit 7 excludes, from the balancing targets, the cell whose balancing time has become 0 due to the update in Step S40. As a result, the cell whose SOC has become equal to the target SOC in the odd cell balancing processing in Step S30 is excluded from targets of the subsequent balancing.

In Step S60, the first control unit 7 determines whether or not there is an even cell that is a balancing target. In a case where the determination result indicates that the balancing target cells still include at least one even cell, the flow proceeds to Step S80, and the odd cell balancing processing in Step S30 is followed by even cell balancing processing. On the other hand, in a case where the balancing target cells include no even cell, that is, in a case where the SOCs of the even cells are all equal to the target SOC and the balancing is completed, the flow proceeds to Step S70.

In Step S70, the first control unit 7 determines whether or not there is an odd cell that is a balancing target. In a case where the determination result indicates that the balancing target cells still include at least one odd cell, the flow returns to Step S30, and the odd cell balancing processing is continued. On the other hand, in a case where the balancing target cells include no odd cell, that is, in a case where the SOCs of the odd cells are all equal to the target SOC and the balancing is completed, the flowchart of FIG. 3 ends.

In Step S80, the first control unit 7 performs the even cell balancing processing for performing the balancing control for even cells. In the even cell balancing processing, balancing is performed for even cells among the balancing target cells set in Step S20. However, an even cell excluded from the balancing targets in Step S100, which will be described later, is not a processing target in Step S80. Note that the even cell balancing processing in Step S80 will be described in detail later with reference to the flowchart of FIG. 5.

In Step S90, the first control unit 7 updates the balancing time for each even cell that is the balancing target cell. Here, the balancing time for each even cell is updated by subtracting an even cell discharge time Te set in the even cell balancing processing in Step S80 from the balancing time for each even cell that is the balancing target cell. Note that a method of setting the even cell discharge time Te will be described later in the description of the even cell balancing processing.

In Step S100, the first control unit 7 excludes, from the balancing targets, the cell whose balancing time has become 0 due to the update in Step S90. As a result, the cell whose SOC has become equal to the target SOC in the even cell balancing processing in Step S80 is excluded from targets of the subsequent balancing.

In Step S110, the first control unit 7 determines whether or not there is an odd cell that is a balancing target. In a case where the determination result indicates that the balancing target cells still include at least one odd cell, the flow returns to Step S30, and the even cell balancing processing in Step S80 is followed by the odd cell balancing processing. On the other hand, in a case where the balancing target cells include no odd cell, that is, in a case where the SOCs of the odd cells are all equal to the target SOC and the balancing is completed, the flow proceeds to Step S120.

In Step S120, the first control unit 7 determines whether or not there is an even cell that is a balancing target. In a case where the determination result indicates that the balancing target cells still include at least one even cell, the flow returns to Step S80, and the even cell balancing processing is continued. On the other hand, in a case where the balancing target cells include no even cell, that is, in a case where the SOCs of the even cells are all equal to the target SOC and the balancing is completed, the flowchart of FIG. 3 ends.

In the CCU 1 of the battery management system of the present embodiment, the balancing control as described above is performed by the first control unit 7. In the balancing control, the odd cell balancing processing in Step S30 and the even cell balancing processing in Step S80 are alternately and repeatedly performed until the balancing of all of the balancing target cells is completed. Therefore, as described in FIG. 2, it is possible to alternately repeat the balancing of odd cells and balancing of even cells, such that the SOC of each cell becomes equal to the target SOC.

Figure 4:
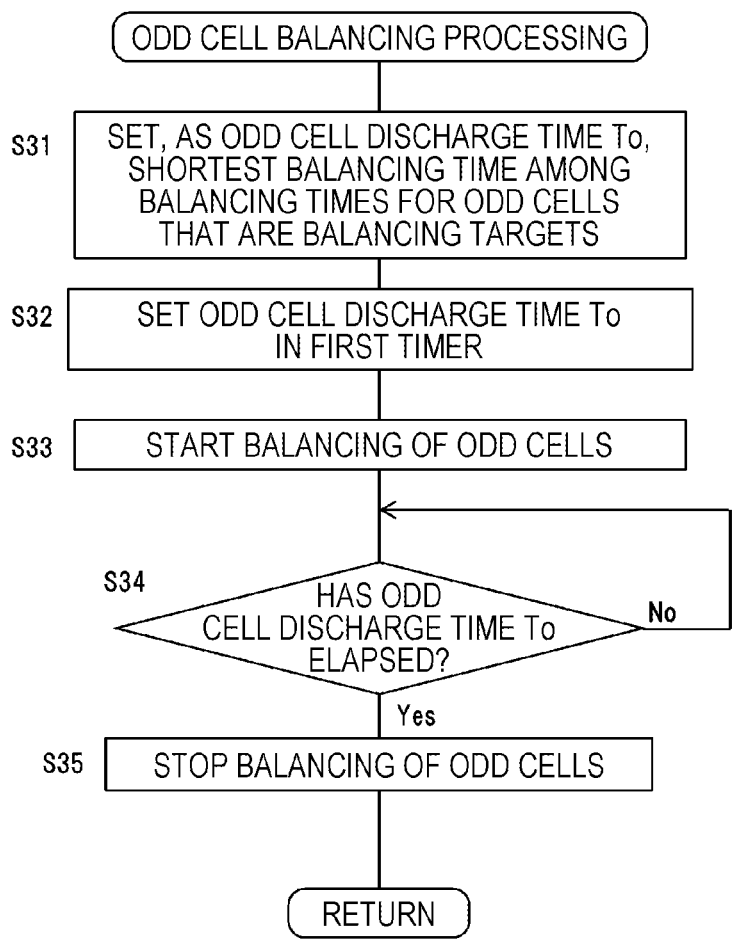
FIG. 4 is a flowchart of odd cell balancing processing.

Next, the odd cell balancing processing in Step S30 will be described. FIG. 4 is a flowchart of the odd cell balancing processing.

In Step S31, the first control unit 7 identifies an odd cell whose current balancing time is shortest, that is, an odd cell whose SOC is closest to the target SOC among odd cells that are current balancing target cells. As the balancing time for each odd cell at this time, the balancing time received in Step S10, that is, the balancing time based on the balancing command signal received by the CCU-side receiving unit 14 from the BCU 2, is used when the odd cell balancing processing is performed for the first time in Step S30. On the other hand, in the odd cell balancing processing performed for the second or subsequent times, the balancing time updated in the immediately preceding Step S40 is used. Then, the current balancing time for the identified odd cell, that is, the shortest balancing time among the balancing times for the odd cells that are the current balancing target cells is set as the odd cell discharge time To.

In Step S32, the first control unit 7 sets the odd cell discharge time To set in Step S31 in the first timer 8.

In Step S33, the first control unit 7 starts the balancing of the odd cells that are the current balancing target cells. At this time, the first control unit 7 turns on a balancing switch corresponding to each odd cell that is the balancing target cell among the plurality of balancing switches included in the balancing unit 12, and turns off the other balancing switches. As a result, the balancing unit 12 is controlled so that the discharge is started in a state where the impedance between the positive and negative electrodes of each odd cell that is the balancing target cell is low.

In Step S34, the first control unit 7 uses the first timer 8 to determine whether or not the odd cell discharge time To has elapsed after the balancing of the odd cells is started in Step S33. At this time, the first timer 8 measures an elapsed time after the start of the balancing of the odd cells in Step S33, and once the elapsed time reaches the odd cell discharge time To set in Step S32, the first timer 8 outputs a notification to the first control unit 7. The first control unit 7 determines that the odd cell discharge time To has not elapsed, and the flow stays in Step S34 until the notification is received from the first timer 8, and once the notification is received from the first timer 8, the first control unit 7 determines that the odd cell discharge time To has elapsed, and the flow proceeds to Step S35.

In Step S35, the first control unit 7 stops the balancing of the odd cells started in Step S33. At this time, the first control unit 7 controls the balancing unit so that the discharge of each odd cell that is the balancing target cell is stopped by turning off all balancing switches included in the balancing unit 12.

Once the balancing of the odd cells is stopped in Step S35, the first control unit 7 ends the flowchart of FIG. 4 and completes the odd cell balancing processing. Thereafter, the flow returns to the flowchart of FIG. 3 and proceeds to the next Step S40.

Figure 5:
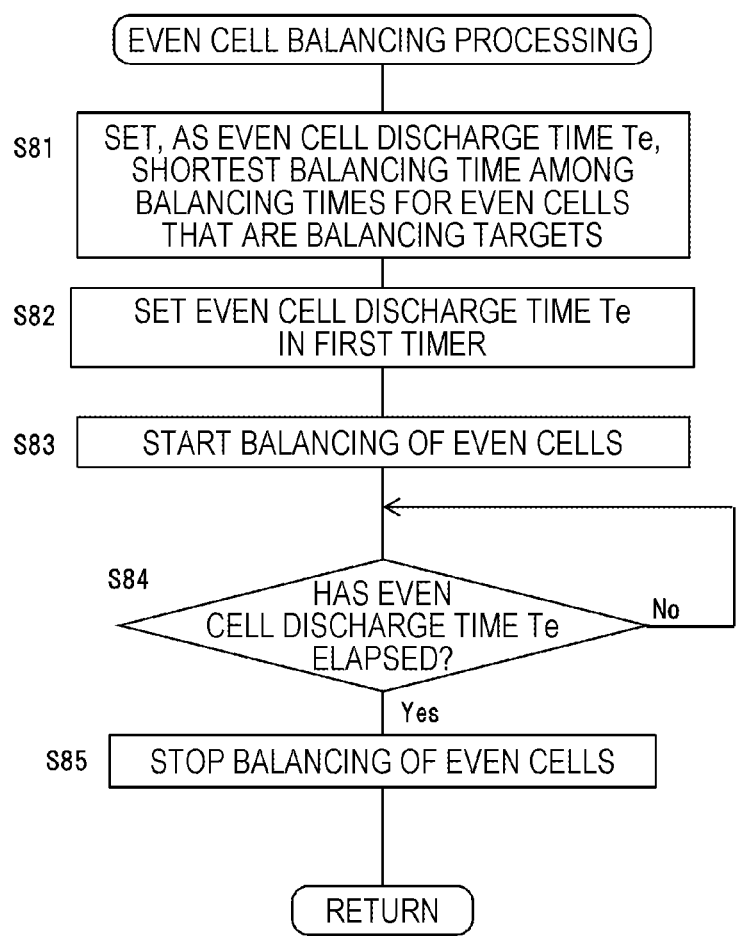
FIG. 5 is a flowchart of even cell balancing processing.

Next, the even cell balancing processing in Step S80 will be described. FIG. 5 is a flowchart of the even cell balancing processing.

In Step S81, the first control unit 7 identifies an even cell whose current balancing time is shortest, that is, an even cell whose SOC is closest to the target SOC among even cells that are current balancing target cells. As the balancing time for each even cell at this time, the balancing time received in Step S10, that is, the balancing time based on the balancing command signal received by the CCU-side receiving unit 14 from the BCU 2, is used when the even cell balancing processing is performed for the first time in Step S80. On the other hand, in the even cell balancing processing performed for the second or subsequent times, the balancing time updated in the immediately preceding Step S90 is used. Then, the current balancing time for the identified even cell, that is, the shortest balancing time among the balancing times for the even cells that are the current balancing target cells is set as the even cell discharge time Te.

In Step S82, the first control unit 7 sets the even cell discharge time Te set in Step S81 in the first timer 8.

In Step S83, the first control unit 7 starts the balancing of the even cells that are the current balancing target cells. At this time, the first control unit 7 turns on a balancing switch corresponding to each even cell that is the balancing target cell among the plurality of balancing switches included in the balancing unit 12, and turns off the other balancing switches. As a result, the balancing unit 12 is controlled so that the discharge is started in a state where the impedance between the positive and negative electrodes of each even cell that is the balancing target cell is low.

In Step S84, the first control unit 7 uses the first timer 8 to determine whether or not the even cell discharge time Te has elapsed after the balancing of the even cells is started in Step S83. At this time, the first timer 8 measures an elapsed time after the start of the balancing of the even cells in Step S83, and once the elapsed time reaches the even cell discharge time Te set in Step S82, the first timer 8 outputs a notification to the first control unit 7. The first control unit 7 determines that the even cell discharge time Te has not elapsed, and the flow stays in Step S84 until the notification is received from the first timer 8, and once the notification is received from the first timer 8, the first control unit 7 determines that the even cell discharge time Te has elapsed, and the flow proceeds to Step S85.

In Step S85, the first control unit 7 stops the balancing of the even cells started in Step S83. At this time, the first control unit 7 controls the balancing unit so that the discharge of each even cell that is the balancing target cell is stopped by turning off all balancing switches included in the balancing unit 12.

Once the balancing of the even cells is stopped in Step S85, the first control unit 7 ends the flowchart of FIG. 5 and completes the even cell balancing processing. Thereafter, the flow returns to the flowchart of FIG. 3 and proceeds to the next Step S90.

According to the first embodiment of the present invention described above, the following effects are exhibited.

(1) The CCU 1 includes the balancing unit 12 which performs the balancing of the SOCs of the battery cells 3 by discharging or charging each of the plurality of battery cells 3 that are secondary batteries, the first timer 8 which measures an elapsed time after the start of the balancing, the CCU-side receiving unit 14 which receives the balancing command signal including information regarding balancing times for the battery cells 3, and the first control unit 7 which controls the balancing unit 12 on the basis of the elapsed time after the start of the balancing, and the balancing command signal, the elapsed time being measured by the first timer 8 and the balancing command signal being received by the CCU-side receiving unit 14. The CCU-side receiving unit 14 receives the information on the balancing times for the plurality of battery cells 3 through a single balancing command signal. Therefore, the BCU 2, which transmits the balancing command signal to the CCU 1, can collectively transmit, to the CCU 1, the information on the balancing times for the plurality of battery cells 3 connected to the CCU 1 through a single balancing command signal. As a result, it is possible to suppress the power consumption of the BCU 2 during the balancing with a simple configuration.

(2) The first control unit 7 sets, as the balancing target cells, respective cells whose balancing time is not 0 among the plurality of battery cells 3 (Step S20), and controls the balancing unit 12 so that balancing of odd cells among the balancing target cells (Steps S30 to S50) and balancing of even cells among the balancing target cells (Steps S80 to S100) are alternately and repeatedly performed. As a result, it is possible to perform the balancing of the plurality of battery cells 3 in a short time without increasing the size of the cell controller IC 5.

(3) The balancing of odd cells performed by the first control unit 7 includes the following processing.
  (a1) Processing of setting the shortest balancing time among the balancing times for the odd cells that are the balancing target cells as the odd cell discharge time To in the first timer 8 on the basis of the balancing command signal or the updated balancing time (Steps S31 and S32)
  (a2) Processing of causing the balancing unit 12 to start the discharge of the odd cells (Step S33)
  (a3) Processing of causing the balancing unit 12 to stop the discharge of the odd cells once the elapsed time after the start of the discharge of the odd cells reaches the odd cell discharge time To (Steps S34 and S35), the elapsed time being measured by the first timer 8
  (a4) Processing of updating the balancing times for each of the odd cells that are the balancing target cells on the basis of the odd cell discharge time To (Step S40)
  (a5) Processing of excluding an odd cell whose updated balancing time is 0 from the balancing target cells (Step S50)

Further, the balancing of even cells performed by the first control unit 7 includes the following processing.
  (b1) Processing of setting the shortest balancing time among the balancing times for the even cells that are the balancing target cells as the even cell discharge time Te in the first timer 8 on the basis of the balancing command signal or the updated balancing time (Steps S81 and S82)
  (b2) Processing of causing the balancing unit 12 to start the discharge of the even cells (Step S83)
  (b3) Processing of causing the balancing unit 12 to stop the discharge of the even cells once the elapsed time after the start of the discharge of the even cells reaches the even cell discharge time Te (Steps S84 and S85), the elapsed time being measured by the first timer 8
  (b4) Processing of updating the balancing time for each of the even cells that are the balancing target cells on the basis of the even cell discharge time Te (Step S90)
  (b5) Processing of excluding an even cell whose updated balancing time is 0 from the balancing target cells (Step S100)

As a result, the first control unit 7 can appropriately perform each of the balancing of the odd cells and the balancing of the even cells.

(4) The CCU-side receiving unit 14 wirelessly receives the balancing command signal. As a result, a wiring between the CCU 1 and the BCU 2 can be omitted, such that the configuration of the battery management system can be further simplified.

(5) The CCU 1 includes the time management unit 9 which stops the CCU 1 when the CCU 1 has an abnormality. As a result, it is possible to prevent the power of the battery cell 3 from being wasted when an abnormality occurs in the CCU 1.

(6) The BCU 2 that can perform communication with the CCU 1 includes the second control unit 16 which computes the balancing times for the plurality of battery cells 3 which are secondary batteries, and the BCU-side transmitting unit 20 which transmits the balancing command signal including information on the balancing time computed by the second control unit 16 to the CCU 1. The BCU-side transmitting unit 20 transmits the information on the balancing times for the plurality of battery cells 3 through a single balancing command signal. As a result, it is possible to suppress the power consumption of the BCU 2 during the balancing.

(7) The BCU-side transmitting unit 20 wirelessly transmits the balancing command signal. As a result, the wiring between the CCU 1 and the BCU 2 can be omitted, such that the configuration of the battery management system can be simplified.

(8) The BCU 2 includes the second timer 17 which measures a time elapsed after the BCU 2 is shifted to the predetermined low power consumption mode. The second control unit 16 sets a predetermined activation time in the second timer 17, and then shifts the BCU 2 to the low power consumption mode. The second timer 17 reactivates the BCU 2 once the time elapsed after the BCU 2 is shifted to the low power consumption mode reaches the activation time. As a result, it is possible to suppress the power consumption of the BCU 2 while regularly performing the balancing.

Second Embodiment

Next, a second embodiment of the present invention will be described. In the first embodiment described above, a balancing control method, in which odd cells and even cells are grouped, respectively, and discharged alternately, has been described. On the other hand, in the present embodiment, a balancing control method, in which all cells are simultaneously discharged, will be described. Note that the configurations of a battery management system and a battery system in the present embodiment and the configurations of a CCU 1 and a BCU 2 are the same as those described in the first embodiment with reference to FIG. 1. Further, similarly to the first embodiment, the BCU 2 transmits, to the CCU 1, information on balancing times for a plurality of battery cells 3 connected to the CCU 1 through a single balancing command signal. Therefore, a description thereof will be omitted below.

Figure 6:
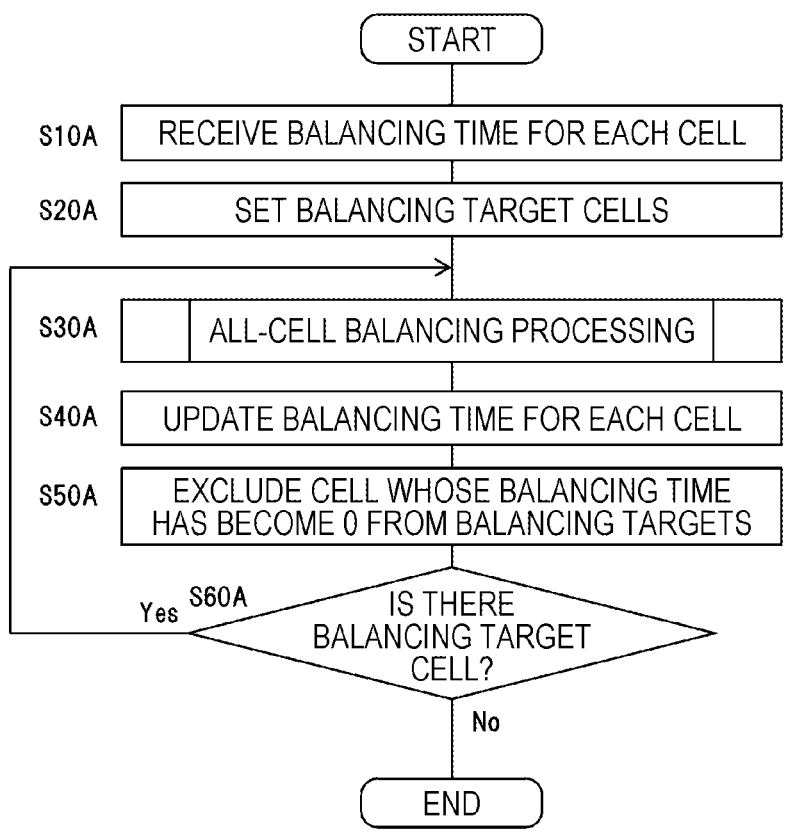
FIG. 6 is a flowchart of a balancing control according to a second embodiment of the present invention.

FIG. 6 is a flowchart of the balancing control according to the second embodiment of the present invention. In the CCU 1 of the battery management system of the present embodiment, for example, when the balancing command signal is transmitted from the BCU 2 and received by the CCU-side receiving unit 14, the first control unit 7 performs the balancing control illustrated in the flowchart of FIG. 6.

In Step S10A, the first control unit 7 receives the balancing time for each cell from the CCU-side receiving unit 14. Here, similarly to the first embodiment, the CCU-side receiving unit 14 receives and acquires information on the balancing time for each cell, included in the balancing command signal received by the CCU-side receiving unit 14 from the BCU 2.

In Step S20A, the first control unit 7 sets balancing target cells on the basis of the balancing time for each cell received in Step S10A. Here, similarly to the first embodiment, respective cells excluding a cell whose balancing time is 0, that is, a cell having the lowest SOC which is the target SOC, are set as the balancing target cells.

In Step S30A, the first control unit 7 performs all-cell balancing processing for performing the balancing control for all cells. In the all-cell balancing processing, balancing is performed for all of the balancing target cells set in Step S20A. However, a cell excluded from the balancing targets in Step S50A, which will be described later, is not a processing target in Step S30A. Note that the all-cell balancing processing in Step S30A will be described in detail later with reference to the flowchart of FIG. 7.

In Step S40A, the first control unit 7 updates the balancing time for each cell that is the balancing target cell. Here, the balancing time for each cell is updated by subtracting an all-cell discharge time Ta set in the all-cell balancing processing in Step S30A from the balancing time for each balancing target cell. Note that a method of setting the all-cell discharge time Ta will be described later in the description of the all-cell balancing processing.

In Step S50A, the first control unit 7 excludes, from the balancing targets, the cell whose balancing time has become 0 due to the update in Step S40A. As a result, the cell whose SOC has become equal to the target SOC in the all-cell balancing processing in Step S30A is excluded from targets of the subsequent balancing.

In Step S60A, the first control unit 7 determines whether or not there is a balancing target cell. In a case where the determination result indicates that there is at least one balancing target cell, the flow returns to Step S30A, and the all-cell balancing processing is continued. On the other hand, in a case where there is no balancing target cell, that is, in a case where the SOCs of all cells are equal to the target SOC and the balancing is completed, the flowchart of FIG. 6 ends.

In the CCU 1 of the battery management system of the present embodiment, the balancing control as described above is performed by the first control unit 7. In the balancing control, the all-cell balancing processing in Step S30A is repeatedly performed until the balancing of all of the balancing target cells is completed. Therefore, it is possible to make the SOC of each cell equal to the target SOC.

Figure 7:
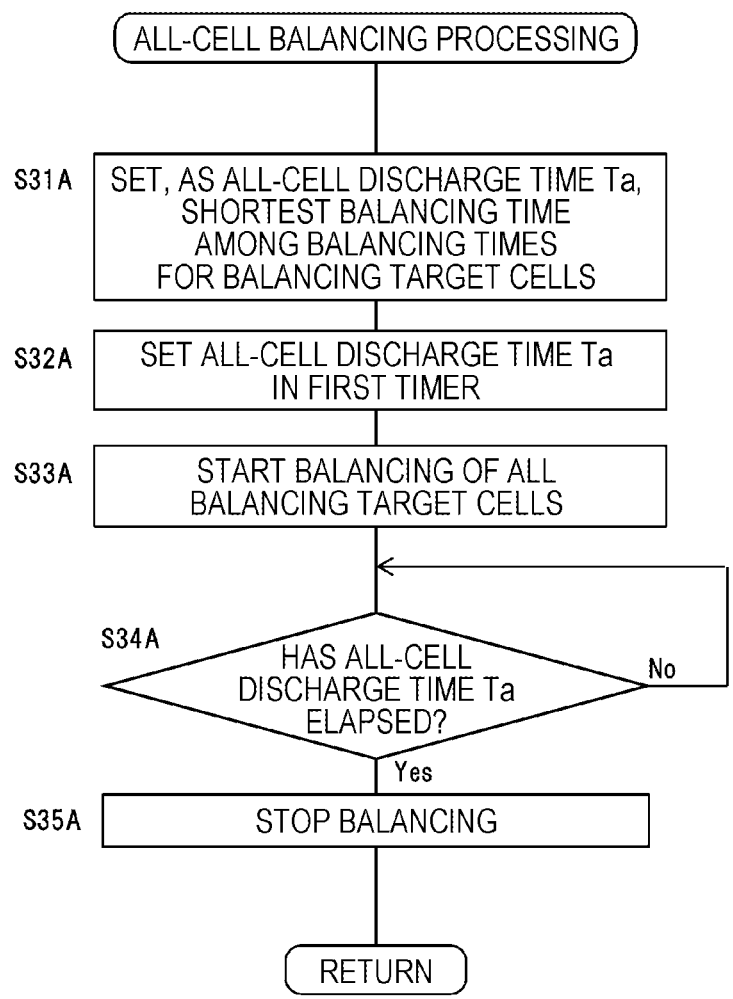
FIG. 7 is a flowchart of all-cell balancing processing.

Next, the all-cell balancing processing in Step S30A will be described. FIG. 7 is a flowchart of the all-cell balancing processing.

In Step S31A, the first control unit 7 identifies a cell whose current balancing time is shortest, that is, a cell whose SOC is closest to the target SOC among current balancing target cells. As the balancing time for each cell at this time, the balancing time received in Step S10A, that is, the balancing time based on the balancing command signal received by the CCU-side receiving unit 14 from the BCU 2, is used when the all-cell balancing processing is performed for the first time in Step S30A. On the other hand, in the all-cell balancing processing performed for the second or subsequent times, the balancing time updated in the immediately preceding Step S40A is used. Then, the current balancing time for the identified cell, that is, the shortest balancing time among the balancing times for the current balancing target cells is set as the all-cell discharge time Ta.

In Step S32A, the first control unit 7 sets the all-cell discharge time Ta set in Step S31A in the first timer 8.

In Step S33A, the first control unit 7 starts the balancing of all of the current balancing target cells. At this time, the first control unit 7 turns on a balancing switch corresponding to each balancing target cell among the plurality of balancing switches included in the balancing unit 12, and turns off the other balancing switches. As a result, the balancing unit 12 is controlled so that the discharge is started in a state where the impedance between the positive and negative electrodes of each balancing target cell is low.

In Step S34A, the first control unit 7 uses the first timer 8 to determine whether or not the all-cell discharge time Ta has elapsed after the balancing of all of the balancing target cells is started in Step S33A. At this time, the first timer 8 measures an elapsed time after the start of the balancing of all of the balancing target cells in Step S33A, and once the elapsed time reaches the all-cell discharge time Ta set in Step S32A, the first timer 8 outputs a notification to the first control unit 7. The first control unit 7 determines that the all-cell discharge time Ta has not elapsed, and the flow stays in Step S34A until the notification is received from the first timer 8, and once the notification is received from the first timer 8, the first control unit 7 determines that the all-cell discharge time Ta has elapsed, and the flow proceeds to Step S35A.

In Step S35A, the first control unit 7 stops the balancing of all of the balancing target cells started in Step S33A. At this time, the first control unit 7 controls the balancing unit 12 so that the discharge of each balancing target cell is stopped by turning off all the balancing switches included in the balancing unit 12.

Once the balancing of all of the balancing target cells is stopped in Step S35A, the first control unit 7 ends the flowchart of FIG. 7 and completes the all-cell balancing processing. Thereafter, the flow returns to the flowchart of FIG. 6 and proceeds to the next Step S40A.

According to the second embodiment of the present invention described above, in addition to (1), and (4) to (8) described in the first embodiment, the following effects are exhibited.

(9) The first control unit 7 sets, as the balancing target cells, respective cells whose balancing time is not 0 among the plurality of battery cells 3 (Step S20A), and controls the balancing unit 12 so that balancing of all of the balancing target cells is repeatedly performed (Steps S30A to S50A). As a result, the balancing times for the plurality of battery cells 3 can be further shortened, such that it is possible to further reduce the power of the battery cells 3 consumed by the CCU 1 at the time of performing the balancing. However, it may be necessary to increase the size of the cell controller IC 5 as compared with the first embodiment.

(10) The balancing of all of the balancing target cells performed by the first control unit 7 includes the following processing.

(c1) Processing of setting the shortest balancing time among the balancing times for the balancing target cells as the all-cell discharge time Ta in the first timer on the basis of the balancing command signal or the updated balancing time (Steps S31A and S32A)

(c2) Processing of causing the balancing unit 12 to start the discharge of the balancing target cells (Step S33A)

(c3) Processing of causing the balancing unit 12 to stop the discharge of the balancing target cells once the elapsed time after the start of the discharge of the balancing target cells reaches the all-cell discharge time Ta (Steps S34A and S35A), the elapsed time being measured by the first timer 8

(c4) Processing of updating the balancing time for each of the balancing target cells on the basis of the all-cell discharge time Ta (Step S40A)

(c5) Processing of excluding a cell whose updated balancing time is 0 from the balancing target cells (Step S50A)

As a result, the first control unit 7 can appropriately perform the balancing of all of the balancing target cells.

Third Embodiment

Next, a third embodiment of the present invention will be described. In the present embodiment, a balancing control method in which cells are sequentially discharged one by one will be described. Note that, similarly to the second embodiment described above, the configurations of a battery management system and a battery system in the present embodiment and the configurations of a CCU 1 and a BCU 2 are the same as those described in the first embodiment with reference to FIG. 1. Further, similarly to the first embodiment, the BCU 2 transmits, to the CCU 1, information on balancing times for a plurality of battery cells 3 connected to the CCU 1 through a single balancing command signal. Therefore, a description thereof will be omitted below.

Figure 8:
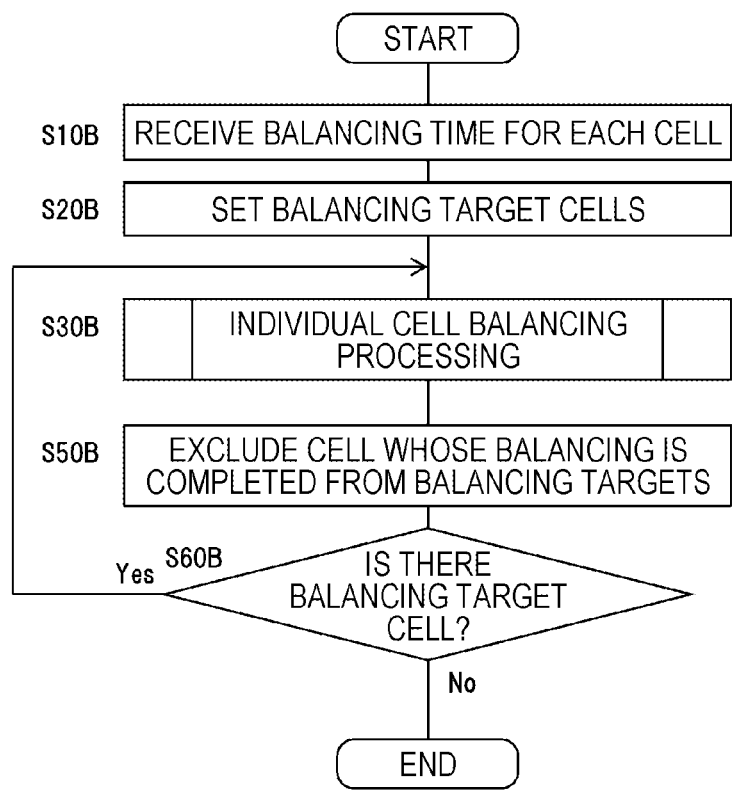
FIG. 8 is a flowchart of a balancing control according to a third embodiment of the present invention.

FIG. 8 is a flowchart of the balancing control according to the third embodiment of the present invention. In the CCU 1 of the battery management system of the present embodiment, for example, when the balancing command signal is transmitted from the BCU 2 and received by the CCU-side receiving unit 14, the first control unit 7 performs the balancing control illustrated in the flowchart of FIG. 8.

In Step S10B, the first control unit 7 receives the balancing time for each cell from the CCU-side receiving unit 14. Here, similarly to the first and second embodiments, the CCU-side receiving unit 14 receives and acquires information on the balancing time for each cell, included in the balancing command signal received by the CCU-side receiving unit 14 from the BCU 2.

In Step S20B, the first control unit 7 sets balancing target cells on the basis of the balancing time for each cell received in Step S10B. Here, similarly to the first and second embodiments, respective cells excluding a cell whose balancing time is 0, that is, a cell having the lowest SOC which is the target SOC, are set as the balancing target cells.

In Step S30B, the first control unit 7 performs individual cell balancing processing for performing the balancing control for each individual balancing target cell. In the individual cell balancing processing, balancing is individually performed for the balancing target cells set in Step S20B one by one. However, a cell excluded from the balancing targets in Step S50B, which will be described later, is not a processing target in Step S30B. Note that the individual cell balancing processing in Step S30B will be described in detail later with reference to the flowchart of FIG. 9.

In Step S50B, the first control unit 7 excludes, from the balancing targets, the cell whose balancing is completed by the individual cell balancing processing in Step S30B. As a result, the cell whose SOC has become equal to the target SOC in the individual cell balancing processing in Step S30B is excluded from targets of the subsequent balancing.

In Step S60B, the first control unit 7 determines whether or not there is a balancing target cell. In a case where the determination result indicates that there is at least one balancing target cell, the flow returns to Step S30B, and the individual cell balancing processing is continued. On the other hand, in a case where there is no balancing target cell, that is, in a case where the SOCs of all cells are equal to the target SOC and the balancing is completed, the flowchart of FIG. 8 ends.

In the CCU 1 of the battery management system of the present embodiment, the balancing control as described above is performed by the first control unit 7. In the balancing control, the individual cell balancing processing in Step S30B is repeatedly performed until the balancing of all of the balancing target cells is completed. Therefore, it is possible to make the SOC of each cell equal to the target SOC.

Figure 9:
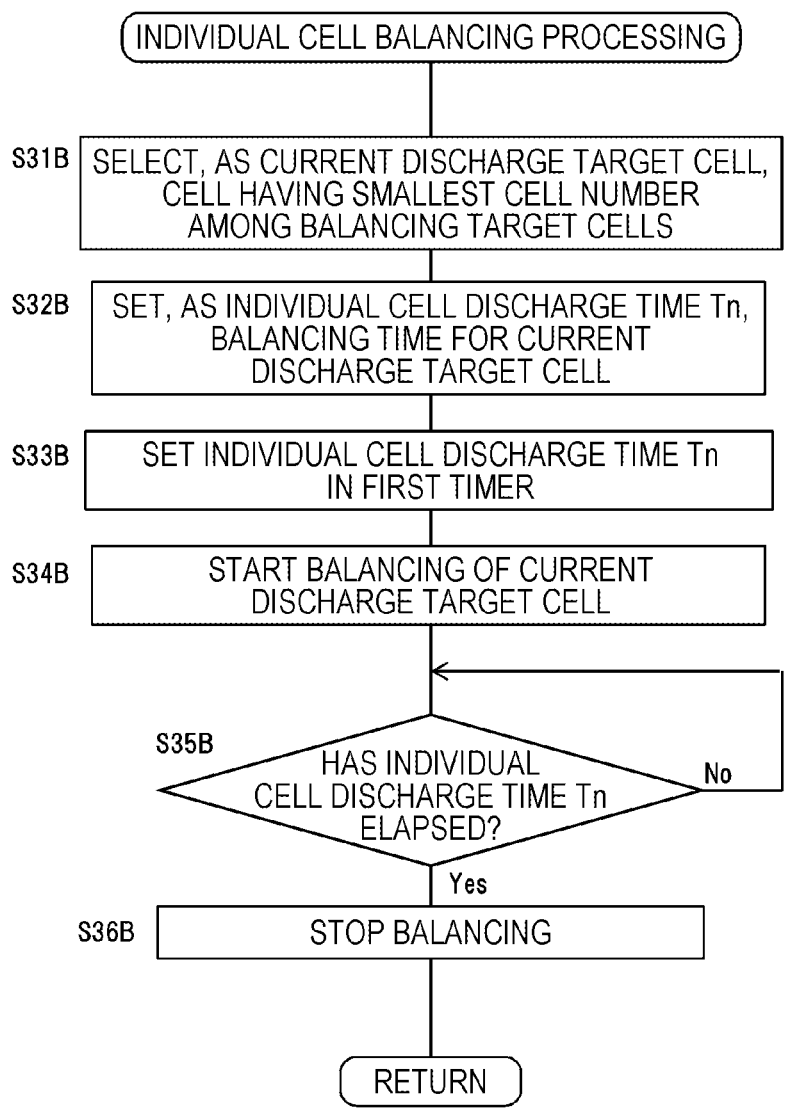
FIG. 9 is a flowchart of individual cell balancing processing.

Next, the individual cell balancing processing in Step S30B will be described. FIG. 9 is a flowchart of the individual cell balancing processing.

In Step S31B, the first control unit 7 selects, as a current discharge target cell, a cell having the smallest number among current balancing target cells, that is, a cell arranged on the lowest potential side. However, a cell having the largest number may be selected instead of the cell having the smallest number. Alternatively, another cell may be selected. Any cell can be selected as the current discharge target cell as long as any one cell can be selected from the current balancing target cells.

In Step S32B, the first control unit 7 sets a balancing time for the current discharge target cell selected in Step S31B as an individual cell discharge time Tn. As the balancing time for the discharge target cell at this time, the balancing time received in Step S10B, that is, the balancing time based on the balancing command signal received by the CCU-side receiving unit 14 from the BCU 2, is used.

In Step S33B, the first control unit 7 sets the individual cell discharge time Tn set in Step S32B in the first timer 8.

In Step S34B, the first control unit 7 starts balancing of the current discharge target cell selected in Step S31B. At this time, the first control unit 7 turns on a balancing switch corresponding to the current discharge target cell among the plurality of balancing switches included in the balancing unit 12, and turns off the other balancing switches. As a result, the balancing unit 12 is controlled so that the discharge is started in a state where the impedance between the positive and negative electrodes of the current discharge target cell is low.

In Step S35B, the first control unit 7 uses the first timer 8 to determine whether or not the individual cell discharge time Tn has elapsed after the balancing of the current discharge target cell is started in Step S34B. At this time, the first timer 8 measures an elapsed time after the start of the balancing of the current discharge target cell in Step S34B, and once the elapsed time reaches the individual cell discharge time Tn set in Step S33B, the first timer 8 outputs a notification to the first control unit 7. The first control unit 7 determines that the individual cell discharge time Tn has not elapsed, and the flow stays in Step S35B until the notification is received from the first timer 8, and once the notification is received from the first timer 8, the first control unit 7 determines that the individual cell discharge time Tn has elapsed, and the flow proceeds to Step S36B.

In Step S36B, the first control unit 7 stops the balancing of the current discharge target cell started in Step S34B. At this time, the first control unit 7 controls the balancing unit 12 so that the discharge of the current discharge target cell is stopped by turning off all the balancing switches included in the balancing unit 12.

Once the balancing of the current discharge target cell is stopped in Step S36B, the first control unit 7 ends the flowchart of FIG. 9 and completes the individual cell balancing processing. Thereafter, the flow returns to the flowchart of FIG. 8 and proceeds to the next Step S50B.

According to the third embodiment of the present invention described above, in addition to (1), and (4) to (8) described in the first embodiment, the following effects are exhibited.

(11) The first control unit 7 sets, as the balancing target cells, respective cells whose balancing time is not 0 among the plurality of battery cells 3 (Step S20B), and controls the balancing unit 12 so that balancing of each individual balancing target cell is repeatedly performed (Steps S30B and S50B). As a result, it is possible to easily perform the balancing control for the plurality of battery cells 3. However, as compared with the first embodiment, a time required for the balancing of all of the battery cells 3 is longer, and the power of the battery cells 3 consumed by the CCU 1 at the time of performing the balancing may be increased.

(12) The balancing of each individual balancing target cell performed by the first control unit 7 includes the following processing.
  (d1) Processing of selecting a discharge target cell from the balancing target cells (Step S31B)
  (d2) Processing of setting a balancing time for the selected discharge target cell as the individual cell discharge time Tn in the first timer 8 on the basis of the balancing command signal (Steps S32B and S33B)
  (d3) Processing of causing the balancing unit 12 to start the discharge of the discharge target cell (Step S34B)
  (d4) Processing of causing the balancing unit 12 to stop the discharge of the discharge target cell once the elapsed time after the start of the discharge of the discharge target cell reaches the individual cell discharge time Tn (Steps S35B and S36B), the elapsed time being measured by the first timer 8
  (d5) Processing of excluding the discharge target cell whose discharge is completed from the balancing target cells (Step S50B)

As a result, the first control unit 7 can appropriately perform the balancing of each individual balancing target cell.

In the present invention, since the CCU 1 is configured as described above, even in a case where there is only one first timer 8 provided for the plurality of battery cells 3, the balancing of the plurality of battery cells 3 can be managed by receiving a single balancing command signal. Therefore, the power consumption of the BCU 2 during the balancing can be reduced, and the power consumption of the battery system can be reduced.

Further, in the present invention, since the BCU 2 is configured as described above, it is possible to perform balancing at a predetermined timing. For example, immediately after the vehicle is stopped, the voltage of the battery cell 3 becomes unstable, and thus, the accuracy in SOC computation deteriorates. Therefore, more precise balancing can be achieved by performing the SOC computation and the balancing at a timing when the voltage of the battery cell 3 after the vehicle is stopped is stable. Further, even when the variation in SOC of the plurality of battery cells 3 is eliminated by performing the balancing, the variation in SOC occurs again over time due to a difference in the self-discharge amount between the battery cells 3. Even in such a case, since the balancing can be regularly performed, it is possible to always suppress the variation in SOC. As a result, it is possible to use a wide SOC area regardless of a timing when the vehicle starts to travel and to extend a cruising range by the battery cells 3.

Note that, although the second control unit 16 in the BCU 2 sets the next activation time in the second timer 17 in each of the above-described embodiments, a fixed value may be set in the second timer 17 to regularly activate the BCU 2. Even in this case, the same effect can be obtained. Further, even in a case where a higher-level system (not illustrated), instead of the second timer 17, activates the BCU 2, the same effect can be obtained.

Further, in each of the above-described embodiments, the CCU 1 receives the information on the balancing time for each battery cell 3 through the balancing command signal, but information other than the balancing time may be received as long as the information is information that can be used by the first control unit 7 to calculate the balancing time. For example, the CCU 1 may receive the cell voltage and SOC of each battery cell 3, and the first control unit 7 may calculate the balancing time for each battery cell 3 on the basis of the cell voltage and the SOC of each battery cell 3. Particularly, in a case of the battery cell 3 in which the cell voltage and the SOC have a high correlation therebetween, the cell voltage may be received instead of the balancing time, and the first control unit 7 may perform a control to equalize the cell voltages. Alternatively, the cell voltage of each battery cell 3 detected by the cell controller IC 5 may be used to perform balancing of the respective battery cells 3.

Further, after the balancing is completed, the CCU 1 may be shifted to the low power consumption mode after setting the next activation time in the first timer 8. As a result, the CCU 1 can be activated even when the BCU 2 is not activated, and thus, the power consumption can be further reduced. For example, the SOH can be accurately calculated by regularly activating the CCU 1, acquiring a change of the information of each battery cell 3 over time, and measuring the self-discharge amount of each battery cell. Further, in a case where the self-discharge amount is known, the change in SOC of each battery cell 3 can be detected in the CCU 1 even when the BCU 2 is not activated. Therefore, the balancing can be regularly performed. As a result, it is possible to suppress the variation in SOC when the BCU 2 is activated next time.

Further, the CCU 1 and the battery cells 3 described in each embodiment can be provided in a set as a battery pack. With such a configuration, the replacement of the CCU 1 and the battery cells 3 due to a failure or version upgrade can be collectively performed by replacing each battery pack, and thus, the replacement of the CCU 1 and the battery cells 3 can be easily performed. In addition, the replacement of BCU 2 can also be facilitated.

Further, in each embodiment described above, an example in which communication between the CCU 1 and the BCU 2 is wirelessly performed has been described, but the same effect can be obtained even in a case where the communication is performed in a wired manner. In general, wireless communication consumes more power than wired communication, and thus, the wireless communication gets more benefit from the effects of the present invention. Note that even in a case of the wired communication, it is preferable that the communication between the CCU 1 and the BCU 2 is insulated by an insulating means. Well-known insulation techniques such as a photocoupler, a photo MOS relay, a pulse transformer, a digital isolator, a capacitor, and the like can be applied. In addition, any connection method can be applied to the connection between the BCU 2 and a plurality of CCUs 1. For example, a so-called star connection method in which the BCU 2 and a plurality of CCUs 1 are connected by the number of CCUs 1, a so-called readback type daisy chain connection method in which CCUs 1 are connected to each other in series and only a CCU 1 at the highest level is connected to the BCU 2, a so-called unidirectional daisy chain connection method in which only a CCU 1 at the highest level and a CCU 1 at the lowest level are connected to the BCU 2, or the like can be applied.

In each embodiment described above, it is preferable that the balancing of each battery cell 3 is performed when the vehicle is stopped and the vehicle is not charged by an external charger. It is possible to perform the balancing operation while the vehicle is traveling or the vehicle is being charged by an external charger, but in these cases, the BCU 2 needs to regularly calculate the allowable power charge/discharge amount and transfer a result of the calculation to a higher-level system. Therefore, it is difficult for the BCU 2 to be shifted to the low power consumption mode. Further, as the balancing operation is performed when the vehicle is stopped and the vehicle is not charged by an external charger, it is possible to ensure a lot of time to perform the balancing operation. As a result, the discharge current can be reduced, such that the structure of the CCU 1 can be simplified. For example, when the balancing operation is performed in a short time while the vehicle is traveling or the vehicle is being charged by an external charger, heat is generated due to a large discharge current, which may lead to breakage of elements or performance deterioration. In order to suppress the breakage of elements or performance deterioration, a heat dissipation structure must be applied to the CCU 1 in some cases. On the other hand, as the balancing operation is performed when the vehicle is stopped and the vehicle is not charged by an external charger, it is not necessary to apply the heat dissipation structure to the CCU 1, and thus, the structure of the CCU 1 can be simplified.

The respective embodiments and various modifications described above are merely examples, and the present invention is not limited to the contents the embodiments and modifications as long as the features of the invention are not impaired. Moreover, although various embodiments and modifications have been described above, the present invention is not limited to the contents thereof. Other aspects conceivable within the scope of the technical idea of the present invention also fall within the scope of the present invention.

The disclosure of the following priority application is herein incorporated by reference:

Japanese Patent Application No. 2018-219305 (filed on Nov. 22, 2018).

REFERENCE SIGNS LIST

1, 1A, 1B cell controller (CCU)
2 battery controller (BCU)
3 battery cell
4 lead storage battery
5 cell controller integrated circuit (cell controller IC)
7 first control unit
8 first timer
9 time management unit
10 CCU-side wireless device
11 CCU-side antenna
12 balancing unit
13 CCU-side transmitting unit
14 CCU-side receiving unit
15 power supply unit
16 second control unit
17 second timer
18 BCU-side wireless device
19 BCU-side antenna
20 BCU-side transmitting unit
21 BCU-side receiving unit

The invention claimed is:

1. A cell controller comprising:
a balancing unit which performs balancing of states of charge of a plurality of secondary batteries by discharging or charging each of the secondary batteries;
a first timer which measures an elapsed time after a start of the balancing;
a receiving unit which receives a single balancing command signal including information regarding balancing times for the secondary batteries; and
a first control unit which controls the balancing unit on a basis of the elapsed time after the start of the balancing, and the single balancing command signal, the elapsed time being measured by the first timer and the single balancing command signal being received by the receiving unit,
wherein the receiving unit receives the information on the plurality of secondary batteries through the single balancing command signal.

2. The cell controller according to claim 1, wherein the first control unit sets, as balancing target cells, respective cells whose balancing time is not 0 among the plurality of secondary batteries, and controls the balancing unit so that the balancing of odd cells among the balancing target cells and the balancing of even cells among the balancing target cells are alternately and repeatedly performed.

3. The cell controller according to claim 2, wherein the balancing of the odd cells includes:
processing of setting a shortest balancing time among balancing times for the odd cells that are the balancing target cells as an odd cell discharge time in the first timer on a basis of the balancing command signal or an updated balancing time;
processing of causing the balancing unit to start discharge of the odd cells;
processing of causing the balancing unit to stop the discharge of the odd cells once an elapsed time after the start of the discharge of the odd cells reaches the odd cell discharge time, the elapsed time being measured by the first timer;
processing of updating the balancing time for each of the odd cells that are the balancing target cells on a basis of the odd cell discharge time; and
processing of excluding an odd cell whose updated balancing time is 0 from the balancing target cells, and
the balancing of the even cells includes:
processing of setting a shortest balancing time among balancing times for the even cells that are the balancing target cells as an even cell discharge time in the first timer on a basis of the balancing command signal or an updated balancing time;
processing of causing the balancing unit to start discharge of the even cells;
processing of causing the balancing unit to stop the discharge of the even cells once an elapsed time after the start of the discharge of the even cells reaches the even cell discharge time, the elapsed time being measured by the first timer;
processing of updating the balancing time for each of the even cells that are the balancing target cells on a basis of the even cell discharge time; and
processing of excluding an even cell whose updated balancing time is 0 from the balancing target cells.

4. The cell controller according to claim 1, wherein the first control unit sets, as balancing target cells, respective cells whose balancing time is not 0 among the plurality of secondary batteries, and controls the balancing unit so that the balancing of all of the balancing target cells is repeatedly performed.

5. The cell controller according to claim 4, wherein the balancing of all of the balancing target cells includes:
processing of setting a shortest balancing time among balancing times for the balancing target cells as an all-cell discharge time in the first timer on a basis of the balancing command signal or an updated balancing time;
processing of causing the balancing unit to start discharge of the balancing target cells;
processing of causing the balancing unit to stop the discharge of the balancing target cells once an elapsed time after the start of the discharge of the balancing target cells reaches the all-cell discharge time, the elapsed time being measured by the first timer;

processing of updating the balancing time for each of the balancing target cells on a basis of the all-cell discharge time; and processing of excluding a cell whose updated balancing time is 0 from the balancing target cells.

6. The cell controller according to claim 1, wherein the first control unit sets, as balancing target cells, respective cells whose balancing time is not 0 among the plurality of secondary batteries, and controls the balancing unit so that the balancing of each individual balancing target cell is repeatedly performed.

7. The cell controller according to claim 6, wherein the balancing of each individual balancing target cell includes:

processing of selecting a discharge target cell from the balancing target cells;

processing of setting a balancing time for the discharge target cell as an individual cell discharge time in the first timer on a basis of the balancing command signal;

processing of causing the balancing unit to start discharge of the discharge target cell;

processing of causing the balancing unit to stop the discharge of the discharge target cell once an elapsed time after the start of the discharge of the discharge target cell reaches the individual cell discharge time, the elapsed time being measured by the first timer; and processing of excluding the discharge target cell whose discharge is completed from the balancing target cells.

8. The cell controller according to claim 1, wherein the receiving unit wirelessly receives the balancing command signal.

9. The cell controller according to claim 1, further comprising a time management unit which stops the cell controller when an abnormality occurs in the cell controller.

10. A battery controller configured to perform communication with the cell controller according to claim 1, the battery controller comprising:

a second control unit which computes balancing times for the plurality of secondary batteries; and a transmitting unit which transmits, to the cell controller, a balancing command signal including information on the balancing times computed by the second control unit, wherein the transmitting unit transmits the information on the plurality of secondary batteries through the single balancing command signal.

11. The battery controller according to claim 10, wherein the transmitting unit wirelessly transmits the balancing command signal.

12. The battery controller according to claim 10, further comprising a second timer which measures a time elapsed after the battery controller is shifted to a predetermined low power consumption mode, wherein the second control unit sets a predetermined activation time in the second timer and then shifts the battery controller to the low power consumption mode, and the second timer reactivates the battery controller once the time elapsed after the battery controller is shifted to the low power consumption mode reaches the activation time.

13. A battery management system comprising:

the cell controller according to claim 1; and a battery controller comprising:

a second control unit which computes balancing times for the plurality of secondary batteries; and a transmitting unit which transmits, to the cell controller, a balancing command signal including information on the balancing times computed by the second control unit, wherein the transmitting unit transmits the information on the plurality of secondary batteries through the single balancing command signal.

14. A battery system comprising:

the battery management system according to claim 13; and a plurality of secondary batteries to be subjected to balancing by the battery management system.

* * * * *